(12) United States Patent
Lin et al.

(10) Patent No.: US 6,252,305 B1
(45) Date of Patent: Jun. 26, 2001

(54) MULTICHIP MODULE HAVING A STACKED CHIP ARRANGEMENT

(75) Inventors: Chun Hung Lin; Kuang-Hui Chen, both of Kaohsiung; Shyh-Wei Wang, Tainan; Su Tao, Kaohsiung, all of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/516,025

(22) Filed: Feb. 29, 2000

(51) Int. Cl.[7] .............. H01L 23/48; H01L 23/52; H01L 23/40
(52) U.S. Cl. .............. 257/777; 257/686; 257/723; 257/783; 257/784; 257/786
(58) Field of Search .............. 257/686, 777, 257/723, 783–784, 786

(56) References Cited

U.S. PATENT DOCUMENTS

| | | |
|---|---|---|
| 5,239,447 * | 8/1993 | Cotues et al. .................. 361/744 |
| 5,323,060 | 6/1994 | Fogal et al. . |
| 5,780,925 * | 7/1998 | Cipolla et al. .................. 257/676 |
| 5,874,781 | 2/1999 | Fogal et al. . |
| 5,886,412 | 3/1999 | Fogal et al. . |
| 5,963,794 | 10/1999 | Fogal et al. . |
| 5,998,864 * | 12/1999 | Khandros et al. ............... 257/723 |

FOREIGN PATENT DOCUMENTS 56-55067 * 5/1981 (JP) ............................... 23/52

* cited by examiner

Primary Examiner—Tom Thomas
Assistant Examiner—Nitin Parekh

(57) ABSTRACT

A multichip module comprises at least two semiconductor chips wherein each has a row of bonding pads formed on the active surface thereof and disposed along one side edge thereof. The semiconductor chips are mounted to a substrate in a stacking arrangement wherein the upper chip is attached to the active surface of the lower chip in a manner that no portion of the upper chip interferes with a vertical line of sight of each bond pad of the lower chip to permit wire bonding thereof. Therefore, all semiconductor chips can be wire bonded simultaneously after stacking the chips on the substrate. This allows wire bonding of all chips to be completed in a single step so as to increase UPH (unit per hour), thereby reducing cost for manufacturing the MCM.

2 Claims, 4 Drawing Sheets

MULTICHIP MODULE HAVING A STACKED CHIP ARRANGEMENT

BACKGROUND OF THE INVENTION

1. Field of the Invention

This invention relates to a multichip module (MCM), and more specifically to a multichip module having a stacked chip arrangement.

2. Description of the Related Art

As electronic devices have become more smaller and thinner, the packages for protecting and interconnecting IC chips have the same trend, too.

With ever increasing demands for miniaturization and higher operating speeds, multichip modules (MCMs) are increasingly attractive in a variety of electronics. MCMs which contain more than one die can help minimize the system operational speed restrictions imposed by long printed circuit board connection traces by combining, for example, the processor, memory, and associated logic into a single package. In addition, MCMs decrease the interconnection length between IC chips thereby reducing signal delays and access times.

The most common MCM is the "side-by-side" MCM. In this version two or more IC chips are mounted next to each other (or side by side each other) on the principal mounting surface of a common substrate. Interconnections among the chips and conductive traces on the substrate are commonly made via wire bonding. The side-by-side MCM, however, suffers from a disadvantage that the package efficiency is very low since the area of the common substrate increases with an increase in the number of semiconductor chips mounted thereon.

Therefore, U.S. Pat. No. 5,323,060 teaches a multichip stacked device (see FIG. 1) comprising a first semiconductor chip 110 attached to a substrate 120 and a second semiconductor chip 130 stacked atop the first semiconductor chip 110. The chips 110, 120 are respectively wire bonded to the substrate 120. U.S. Pat. No. 5,323,060 characterized by using an adhesive layer 140 between the two chips to provide clearance between the chips for the loops of the bonding wires. The wire bonding process of the underlying chip 110 must be completed before the chip 130 can be stacked on the chip 110. This means that the die bonding process must be repeated for each additional layer of the stack. In addition to adding extra process steps, there is a chance of damaging the underlying wires. Additionally, the clearances between two adjacent chips in the stack are quite tight. This will lead to limited processing window in wire binding process, thereby creating reliability problems of the bonding wires.

SUMMARY OF THE INVENTION

Accordingly, it is a primary object of the present invention to provide a multichip module which allows at least two chips in a stack to be attached to the substrate prior to wire bonding.

It is another object of the present invention to provide a multichip module which does not restrict the loop height for the underlying chip, thereby allowing a larger processing window during wire bonding, thereby enhancing the reliability of bonding wires for the underlying chip.

It is a further object of the present invention to provide a multichip module which does not restrict the loop height for the underlying chip, thereby allowing thinner layers of adhesive separating the chips, and reducing the overall height of the assembly.

The multichip module according to a preferred embodiment of the present invention mainly comprises at least two semiconductor chips wherein each has a row of bonding pads formed on the active surface thereof and disposed along one side edge thereof. The semiconductor chips are mounted to a substrate in a stacking arrangement wherein the upper chip is attached to the active surface of the lower chip in a manner that no portion of the upper chip interferes with a vertical line of sight of each bond pad of the lower chip to permit wire bonding thereof. The wire bonding process of the semiconductor chips are performed after stacking the chips on the substrate. Therefore, the multichip module having a stacked chip arrangement in accordance with the present invention characterized in that wire bonding of chips can be completed in a single step so as to increase UPH (unit per hour), thereby reducing cost for manufacturing the MCM.

Further, since no portion of the upper chip interferes with a vertical line of sight of each bond pad of the lower chip, the upper chip does not restrict the loop height for the lower chip. This provides a larger processing window during wire bonding thereby enhancing the reliability of bonding wires for the underlying chip, and allows thinner layers of adhesive separating the chips thereby reducing the overall height of the assembly.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
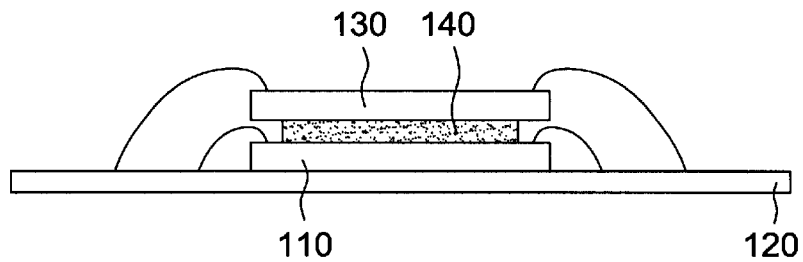
FIG. 1 is a cross-sectional view of a conventional multichip module.
Figure 2:
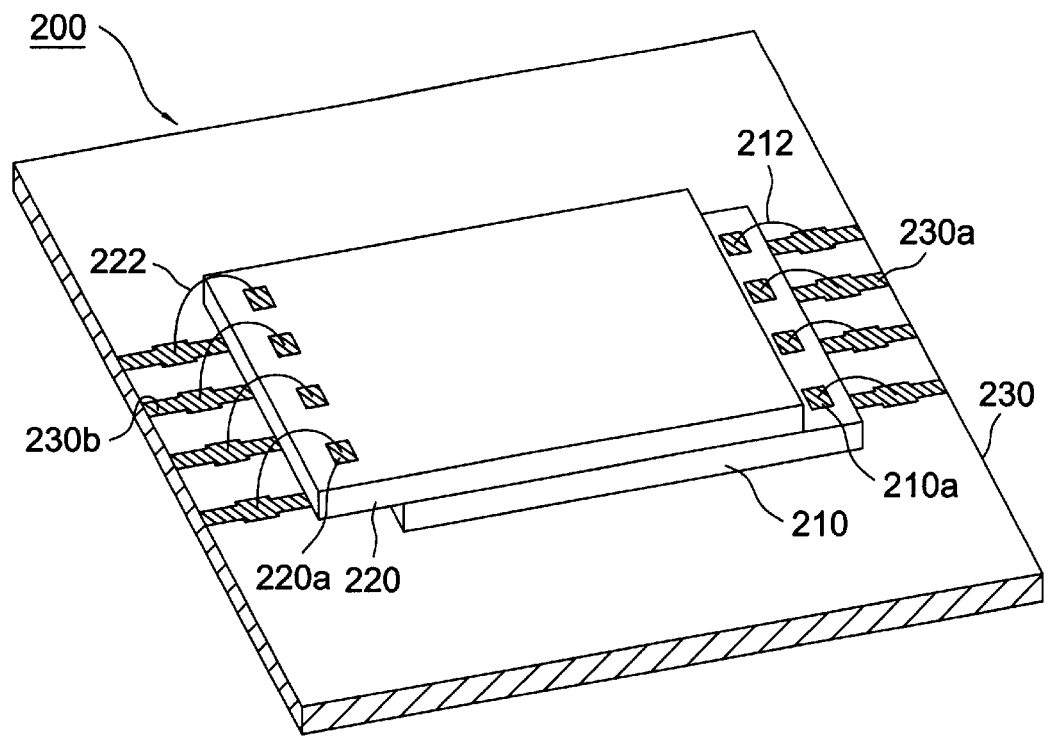
FIG. 2 is a perspective view of a multichip module according to a first embodiment of the present invention wherein the encapsulating material has been removed.

FIG. 2 discloses a multichip module 200 according to a first embodiment of the present invention wherein the encapsulating material has been removed. The multichip module 200 mainly comprises two chips 210, 220 stacked each other and mounted to a substrate 230. The substrate 230 is provided with a structure for making external electrical connection comprising a plurality of conductive traces 230a, 230b. The substrate 230 may be formed from a core layer made of fiberglass reinforced BT (bismaleimide-triazine) resin or FR-4 fiberglass reinforced epoxy resin. Alternatively, the substrate 230 may be a ceramic substrate.

Each of the semiconductor chips 210, 220 has a row of bonding pads (denoted with the numeral 210a, 220a respectively in FIG. 2) formed on the active surface thereof and disposed along one side edge thereof. The backside surface of the semiconductor chip 210 is attached to the substrate by means of an adhesive (not shown). The types of suitable adhesive include epoxy, thermoplastic materials, tape, tape coated with thermoplastic materials, etc, of which tape is preferred in view of thin thickness. The semiconductor chip 220 is attached to the active surface of the chip 210 through an adhesive (not shown) in a manner that no portion of the semiconductor chip 220 interferes with a vertical line of sight of each bond pad 210a to permit wire bonding of the semiconductor chip 210. It is preferable to reserve a distance of at least seven mils between the chip 220 and the bonding pads 210a of the chip 210, thereby providing a larger processing window during wire bonding, and thereby enhancing the reliability of bonding wires 212 for the underlying chip 210. Besides, the side portion of the semiconductor chip 220 having bonding pads 220a formed thereon preferably projects from the semiconductor chip 210 thereby providing a larger space for another semiconductor chip to stack.

Referring to FIG. 2, the bonding pads 210a of the semiconductor chip 210 are electrically connected to the conductive traces through a plurality of bonding wires 212, respectively. The bonding pads 220a of the semiconductor chip 220 are electrically connected to the conductive traces through a plurality of bonding wires 222, respectively. Preferably, the two rows of bonding pads 210a, 220a are substantially parallel and opposing to each other, which makes the bonding wires 212, 222 substantially parallel to the flowing direction of the molding compound during encapsulation. This suppresses the influence of the molding compound thereby reducing the occurrence possibility of wire sweeping, thereby increasing the yield of product.

Figure 3:
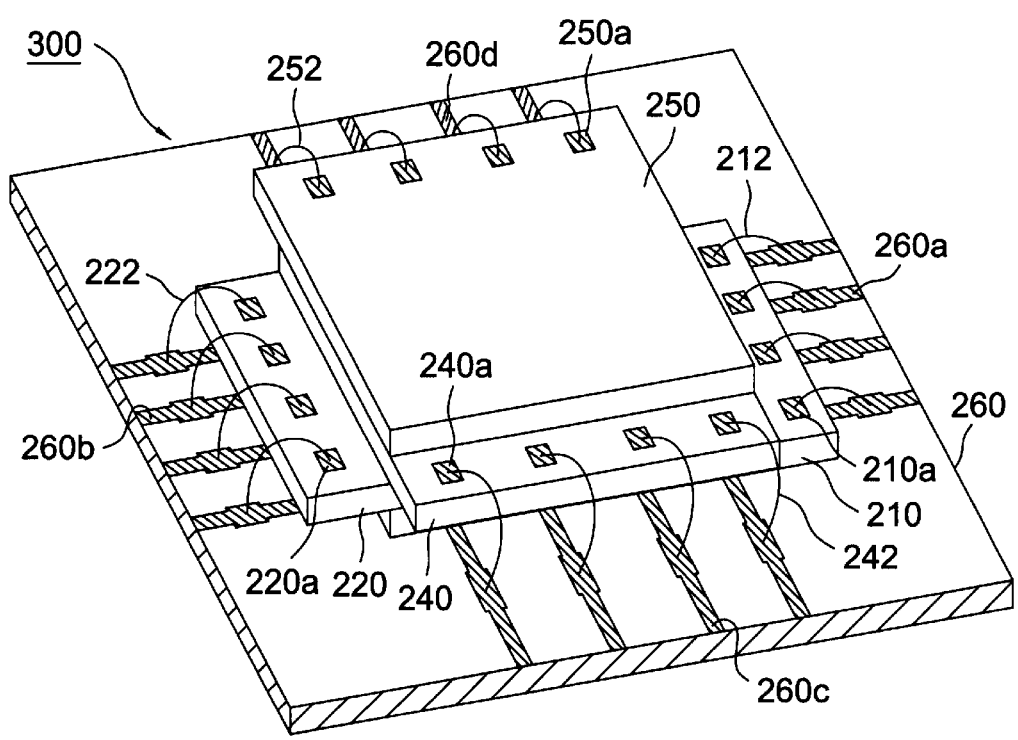
FIG. 3 is a perspective view of a multichip module according to a second embodiment of the present invention wherein the encapsulating material has been removed.
Figure 4:
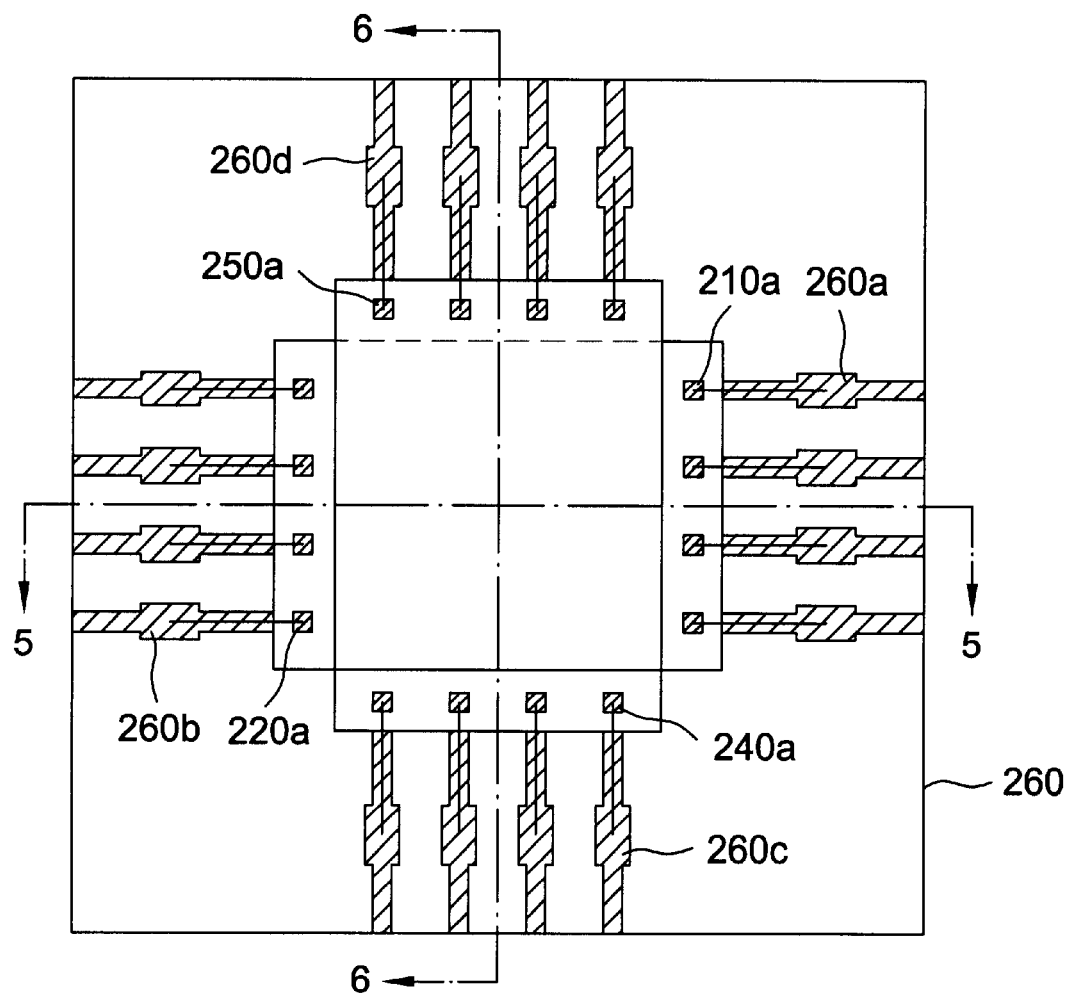
FIG. 4 is a top plan view of the multichip module of FIG. 3 wherein the encapsulating material has been removed.

FIG. 3 discloses a multichip module 300 according to a second embodiment of the present invention wherein the encapsulating material has been removed. The multichip module 300 mainly comprises four chips 210, 220, 240, 250 stacked each other and mounted to a substrate 260. The substrate 260 is provided with a structure for making external electrical connection comprising a plurality of conductive traces 260a, 260b, 260c, 260d. Each of the semiconductor chips 210, 220, 240, 250 has a row of bonding pads (denoted with the numeral 210a, 220a, 240a, 250a respectively in FIG. 3) formed on the active surface thereof and disposed along one side edge thereof. The backside surface of the semiconductor chip 210 is attached to the substrate 260 by means of an adhesive (not shown). The semiconductor chip 220 is attached to the active surface of the chip 210 through an adhesive (not shown) wherein the side portion of the semiconductor chip 220 having bonding pads 220a formed thereon projects from the semiconductor chip 210 (see FIG. 5). And no portion of the semiconductor chip 220 interferes with a vertical line of sight of each bond pad 210a to permit wire bonding of the semiconductor chip 210. The semiconductor chips 240, 250 are attached to the active surface of the chips 220, 240 substantially in the same way described above, respectively. The two rows of bonding pads 240a, 250a are substantially perpendicular to the two rows of bonding pads 210a, 220a. Referring to FIG. 6, the side portion of the semiconductor chip 240 having bonding pads 240a formed thereon projects from the semiconductor chip 220, and the side portion of the semiconductor chip 250 having bonding pads 250a formed thereon projects from the semiconductor chip 240. It should be understood that the width of the semiconductor chips 240, 250 is smaller than the perpendicular distance separating the two rows of bonding pads 210a, 220a thereby avoiding the vertical line of sight of each bond pad 210a, 220a from being interfered, thereby permitting wire bonding of the semiconductor chip 210, 220. Therefore, wire bonding of the bonding pads 210a, 220a, 240a, 250a can be completed in a single step.

Figure 5:
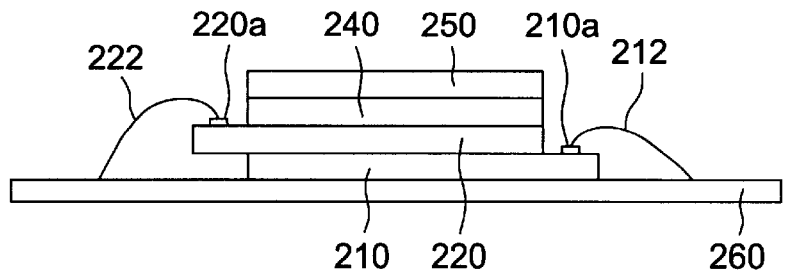
FIG. 5 is a cross sectional view taken from the line 5—5 of FIG. 4.
Figure 6:
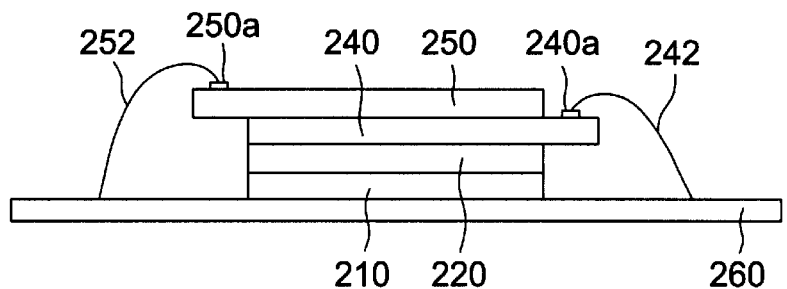
FIG. 6 is a cross sectional view taken from the line 6—6 of FIG. 4.

Referring to FIG. 5 and FIG. 6, comparing to bonding wires 212, 222 for chips 210, 220, the bonding wires 242, 252 are more prone to have problems of wire sweeping because the distance from the bonding pads 240a, 250a on the chips 240, 250 to the substrate 260 is longer. Therefore, in the multichip module 300 of the present invention, the two rows of bonding pads 240a, 250a are substantially parallel and opposing to each other, whereby the bonding wires 242, 252 can be simultaneously disposed parallel to the flowing direction of the molding compound during encapsulation. This suppresses the influence of the molding compound on the bonding wires 242, 252 thereby reducing the occurrence possibility of wire sweeping, thereby increasing the yield of product.

Figure 7:
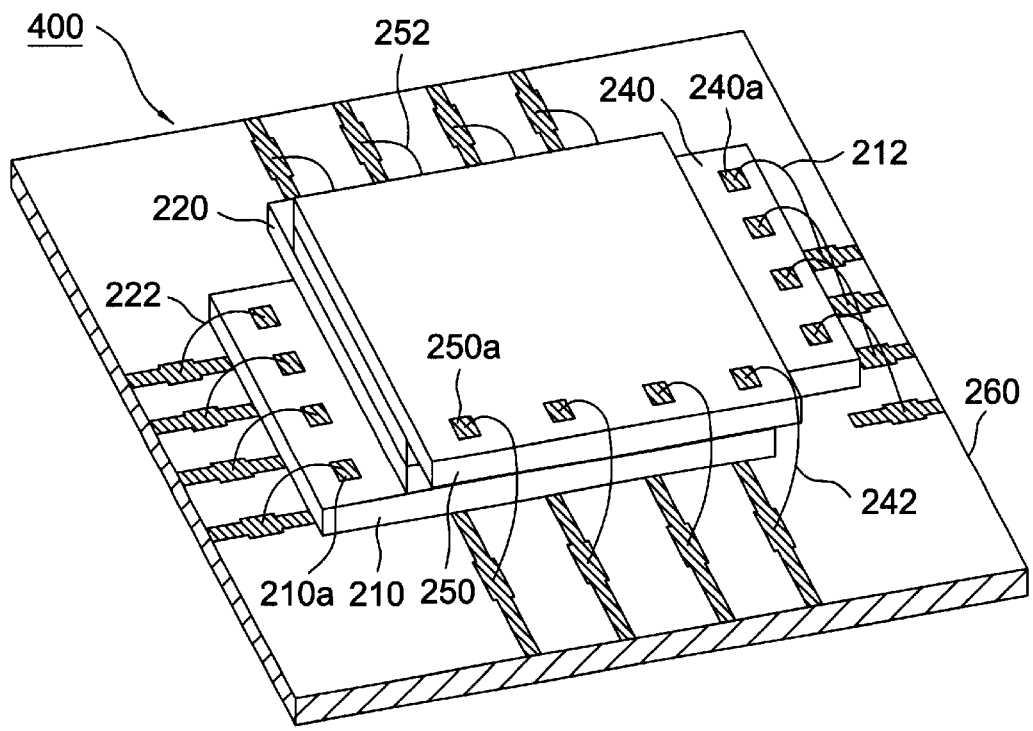
FIG. 7 is a perspective view of a multichip module according to a third embodiment of the present invention wherein the encapsulating material has been removed.

FIG. 7 discloses a multichip module 400 according to a third embodiment of the present invention wherein the encapsulating material has been removed. The multichip module 400 is substantially identical to the multichip module 300 of FIG. 3 with exception that the bonding pads 220a on the semiconductor chip 220 are substantially perpendicular to the bonding pads 210a on the semiconductor chip 210, the bonding pads 240a on the semiconductor chip 240 are substantially perpendicular to the bonding pads 220a, and the bonding pads 250a on the semiconductor chip 250 are substantially perpendicular to the bonding pads 240a. It should be understood that the width of the semiconductor chip 250 is smaller than the perpendicular distance separating the two rows of bonding pads 210a, 240a. Therefore, wire bonding of the bonding pads 210a, 220a, 240a, 250a can be completed in a single step.

The second and the third embodiments in accordance with the present invention characterized in that the stacking arrangement of four semiconductor chips is optimized for maximum package efficiency while allowing wire bonding of the four chips to be completed in a single step.

According to the multichip modules in accordance with preferred embodiments of the present invention, upper chips are stacked upon the lower chips to increase package efficiency in a manner that no portion of the upper chips interferes with a vertical line of sight of each bond pad of the lower chips to permit wire bonding thereof. Therefore, all semiconductor chips can be wire bonded after stacking the chips on the substrate. This allows wire bonding of all chips to be completed in a single step so as to increase UPH (unit per hour), thereby reducing cost for manufacturing the MCM.

Further, since no portion of the upper chip interferes with a vertical line of sight of each bond pad of the lower chip, the upper chip does not restrict the loop height for the lower chip. This provides a larger processing window during wire bonding thereby enhancing the reliability of bonding wires for the underlying chip, and allows thinner layers of adhesive separating the chips thereby reducing the overall height of the assembly.

Although the invention has been explained in relation to its preferred embodiment, it is to be understood that many other possible modifications and variations can be made without departing from the spirit and scope of the invention as hereinafter claimed.

What is claimed is:

1. A multichip module comprising:
   a substrate having a structure for making external electrical connection;

first, second, third and fourth semiconductor chips each consisting essentially of a single row of bonding pads formed on an active surface thereof and disposed on a side portion thereof, wherein said first chip being attached to the substrate;

said second chip being attached to the active surface of the first chip such that the two respective rows of bonding pads on the first and second chips are substantially parallel and opposing to each other, and the side portion of the second chip having bonding pads formed thereon projects from the first chip;

said third chip being attached to the active surface of the second chip such that the row of bonding pads on the third chip is substantially perpendicular to the two rows of bonding pads on the first and second chips;

said fourth chip being attached to the active surface of the third chip such that the two rows of bonding pads on the third and fourth chips are substantially parallel and opposing to each other, and the side portion of the fourth chip having bonding pads formed thereon projects from the third chip; and said third and fourth chips each have a width smaller than a perpendicular distance separating the two rows of bonding pads on the first and second chips; and a plurality of bonding wires electrically connecting the bonding pads of each chip to the structure for making external electrical connection.

2. A multichip module comprising:

a substrate having a structure for making external electrical connection;

first, second, third and fourth semiconductor chips each consisting essentially of a single row of bonding pads formed on an active surface thereof and disposed on a side portion thereof, wherein said first chip being attached to the substrate;

said second chip being attached to the active surface of the first chip such that the row of bonding pads on the second chip is substantially perpendicular to the row of bonding pads on the first chip, and the side portion of the second chip having bonding pads formed thereon projects from the first chip;

said third chip being attached to the active surface of the second chip such that the row of bonding pads on the third chip is substantially perpendicular to the row of bonding pads on the second chip, and the side portion of the third chip having bonding pads formed thereon projects from the second chip;

said fourth chip being attached to the active surface of the third chip such that the row of bonding pads on the fourth chip is substantially perpendicular to the row of bonding pads on the third chip, and the side portion of the fourth chip having bonding pads formed thereon projects from the third chip; and the second and fourth chips each having a width smaller than a perpendicular distance separating the two respective rows of bonding pads on the first and third chips; and a plurality of bonding wires electrically connecting the bonding pads of each chips to the structure for making external electrical connection.

* * * * *